United States Patent
Au et al.

[11] Patent Number: 5,719,520
[45] Date of Patent: Feb. 17, 1998

[54] MULTI-VALUED ROM CIRCUIT #7

[75] Inventors: Rita Wai-Chi Au, Miyagi-ken; Tadashi Shibata, 5-2, Nihondaira, Taihaku-ku, Sendai-shi, Miyagi-ken; Tadahiro Ohmi, Miyagi-ken, all of Japan

[73] Assignee: Tadashi Shibata, Japan

[21] Appl. No.: 537,729

[22] PCT Filed: Feb. 15, 1994

[86] PCT No.: PCT/JP94/00217

§ 371 Date: Oct. 13, 1995

§ 102(e) Date: Oct. 13, 1995

[87] PCT Pub. No.: WO95/22145

PCT Pub. Date: Aug. 17, 1995

[51] Int. Cl.⁶ .................................. H03K 17/687
[52] U.S. Cl. .............. 327/427; 327/429; 365/185.01; 365/185.03; 365/185.14
[58] Field of Search .......................... 327/427, 429, 327/479; 365/185.01, 185.03, 185.1, 185.14

[56] References Cited

U.S. PATENT DOCUMENTS

| | | | |
|---|---|---|---|
| 4,090,257 | 5/1978 | Williams | 365/184 |
| 4,314,265 | 2/1982 | Simko | 357/23 |
| 4,462,090 | 7/1984 | Iizuka | 365/185 |
| 4,630,087 | 12/1986 | Momodomi | 365/185.14 |
| 4,631,686 | 12/1986 | Ikawa et al. | 364/490 |
| 4,961,002 | 10/1990 | Tam et al. | 307/201 |
| 5,258,657 | 11/1993 | Shibata et al. | 307/201 |
| 5,280,446 | 1/1994 | Ma et al. | 365/185 |
| 5,469,085 | 11/1995 | Shibata et al. | 326/121 |
| 5,539,329 | 7/1996 | Shibata et al. | 326/39 |
| 5,587,668 | 12/1996 | Shibata et al. | 326/36 |

OTHER PUBLICATIONS

Shibata & Ohmi "1991 Symposium On VLSI Technology; Digest Of Technical Papers; Jun. 2–4 1992", Seattle, XP342723.

IEEE Transactions On Electron Devices, vol. 39, No. 6, Jun. 1992, New York, pp. 1444–1455, XP271791 Shibata & Ohmi "A Functional MOS Transistor Featuring Gate–Level Weighted Sum And Threshold Operations."

*Primary Examiner*—Timothy P. Callahan
*Assistant Examiner*—Jeffrey Zweigig
*Attorney, Agent, or Firm*—Baker & Daniels

[57] ABSTRACT

A semiconductor circuit which realizes a read-only memory cell having zero stand-by power consumption and capable of non-volatile storage of multiple-valued or analog data. This semiconductor device is comprises of at least a single-channel or p-channel MOS transistor in a source-follower circuit configuration. The input of this source-follower circuit is a floating gate which is capacitively coupled to multiple control gates. The voltages applied to the control gates and the coupling ratios of the control gates determine the potential of the floating gate. When a voltage supply is applied to the drain electrode of the source-follower circuit, the source-electrode potential will nearly equal the floating gate potential.

9 Claims, 8 Drawing Sheets

4-valued cells 8-valued cells

| VALUE | $V_1$ | $V_2$ | $\phi_F$ |
|---|---|---|---|
| 0 | 0 | 0 | 0.00 |
| 1 | WL | 0 | 1.67 |
| 2 | 0 | WL | 3.33 |
| 3 | WL | WL | 5.00 |

TABLE 1

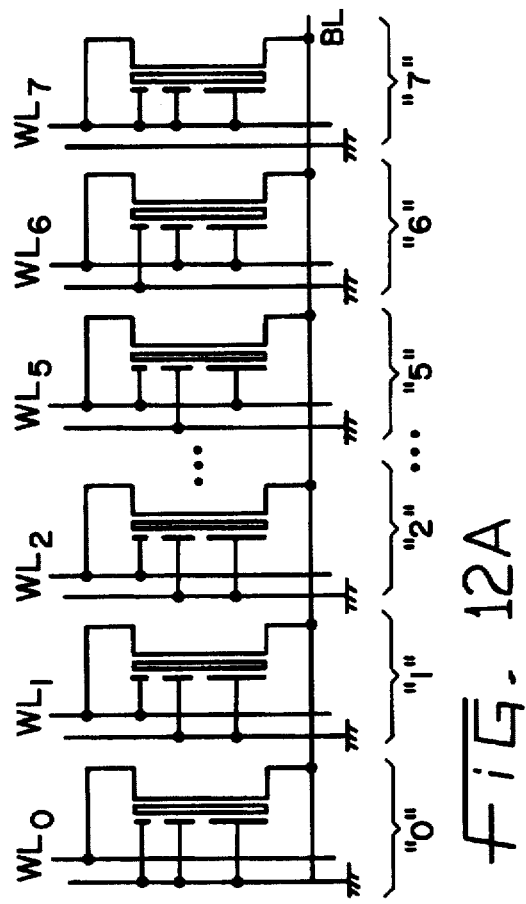
Binary-weighted programming
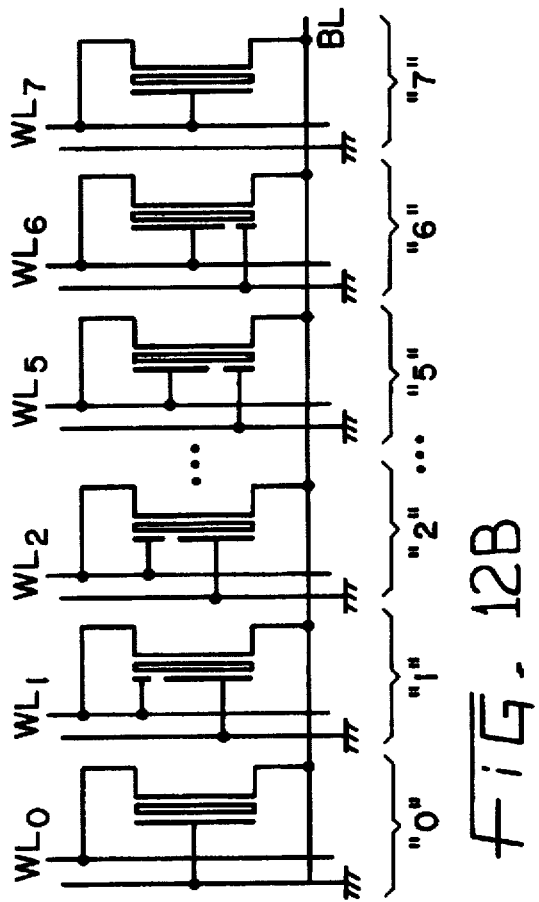
Variably-weighted programming

MULTI-VALUED ROM CIRCUIT #7

TECHNICAL FIELD

The present invention relates to a semiconductor device, and in particular to a high-performance MOS circuit.

BACKGROUND ART

Source-follower circuits are frequently used to drive impedance loads, especially in applications employing analog or multiple-valued signals. Such a circuit is depicted in FIG. 1. This diagram indicates a source-follower circuit comprised of one NMOS transistor (abbreviated as "NMOS") (M10) and a load capacitance (C10); when $V_{IN}$ (101) is greater than $V_T$ (the threshold voltage of M10), current flows to increase $V_{OUT}$ (102) until $$V_{OUT} = V_{IN} - V_T \tag{1}$$

If the gate electrode of an NMOS in a source-follower configuration is made floating, and several input gates are capacitively coupled to the floating gate, as shown in FIG. 2, then the potential of the floating gate ($\phi F$) (201) becomes a linearly weighted summation of the voltages applied to the inputs:

$$\phi_F = \frac{C_1 V_1 + C_2 V_2 + \ldots + C_n V_n}{C_{total}} , \tag{2}$$

where n is the number of input gates, $C_1$ to $C_n$ are the coupling capacitances to the floating gate, and $C_{total}$ is the sum of all coupling capacitances. Therefore, by adjusting the coupling capacitance ratios and the input voltages, the floating gate potential can assume any desired voltage. In this circuit, $V_{OUT}$ (202) will rise until it equals $\phi F - V_T$.

One application of this circuit is the simple 2-bit digital-to-analog (D/A) converter depicted in FIG. 3. By setting the coupling ratio $C_1:C_2=1:2$, and applying 0 V or 5 V to the input gates $V_1$ (301) and $V_2$ (302), four possible states are obtained on the floating gate (303), as shown in Table 1 shown in FIG. 13. In Table 1, the symbol "WL" designates a high level signal applied to the respective inputs, in this case, the high level signal is 5 V. In this manner, the digital signals at $V_1$ and $V_2$ are converted into analog signals at $V_{OUT}$ (304).

DISCLOSURE OF THE INVENTION

The present invention discloses a semiconductor circuit comprising at least a single n-channel or p-channel MOS transistor in a source-follower configuration. The input of this source-follower circuit is a floating gate which is capacitively coupled to multiple control gates. The voltages applied to the control gates and the coupling ratios of the control gates determine the potential of the floating gate. When a voltage supply is applied to the drain electrode of the source-follower circuit, the source-electrode potential will nearly equal the floating gate potential, provided that $V_T \approx 0$ in Equation 1.

The above semiconductor device realizes a single-transistor, read-only memory cell capable of non-volatile storage of multiple-valued or analog data. The data is programmed into the cell by a single masking step during the fabrication process. This cell can be replicated into a matrix of several rows and columns, with all cells in one row sharing a common word line and all cells in one column sharing a common bit line, thus achieving a high-density memory-cell array. Furthermore, this cell does not consume any standby-by power.

BRIEF DESCRIPTION OF THE DRAWINGS

FIG. 12 is a circuit diagram showing 8-valued cells which compares programming with (a) binary-weighted capacitors and (b) variably-weighted capacitors of Embodiment 5.

BEST MODE FOR CARRYING OUT THE INVENTION

Herein below, the present invention will be explained in detail based on embodiments; however, the present invention is of course not limited to these embodiments.

(Embodiment 1)

Figure 1:
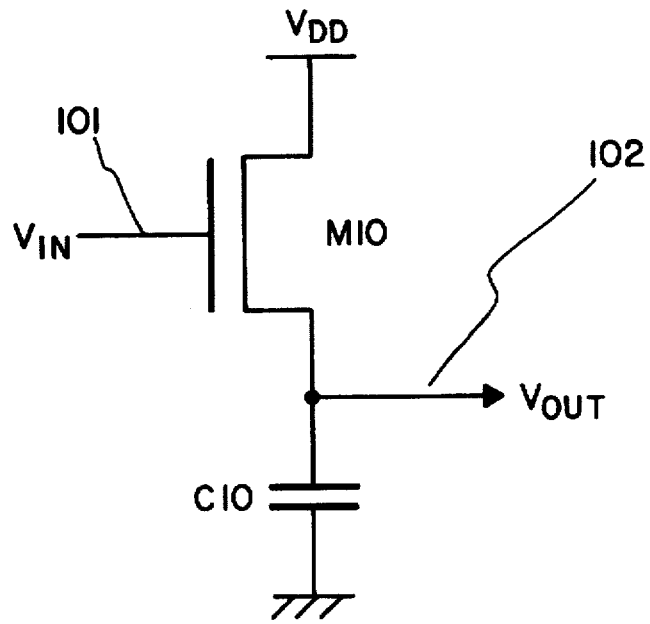
FIG. 1 is a circuit diagram showing a typical NMOS source-follower circuit.
Figure 2:
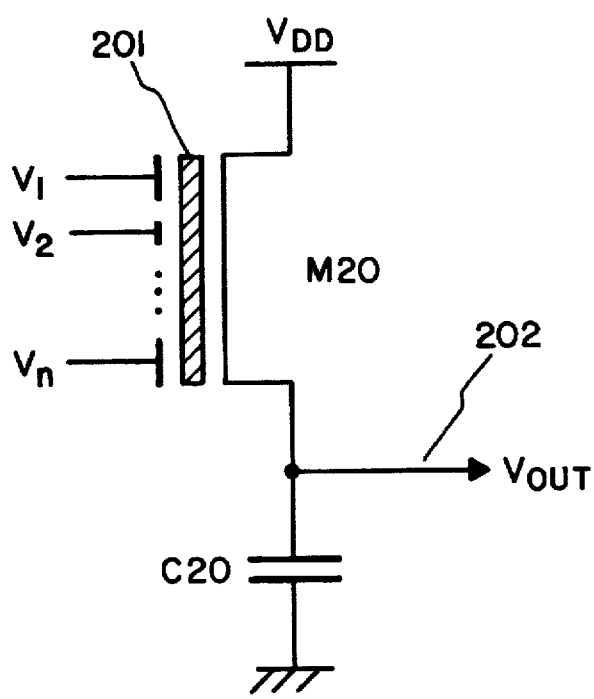
FIG. 2 is a circuit diagram showing an NMOS source-follower circuit with multiple input gates capacitively coupled to its floating gate electrode.
Figure 3:
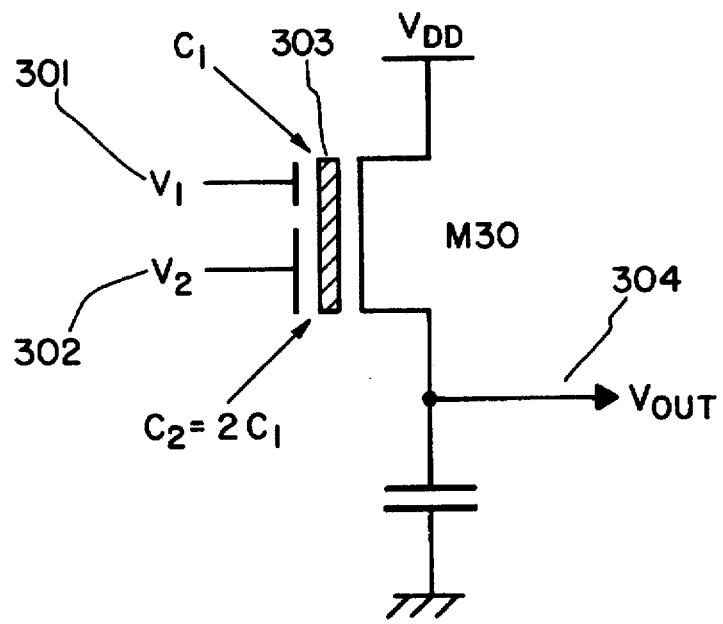
FIG. 3 is a circuit diagram showing a 2-bit digital-to-analog converter using a floating-gate NMOS source follower.
Figure 4:
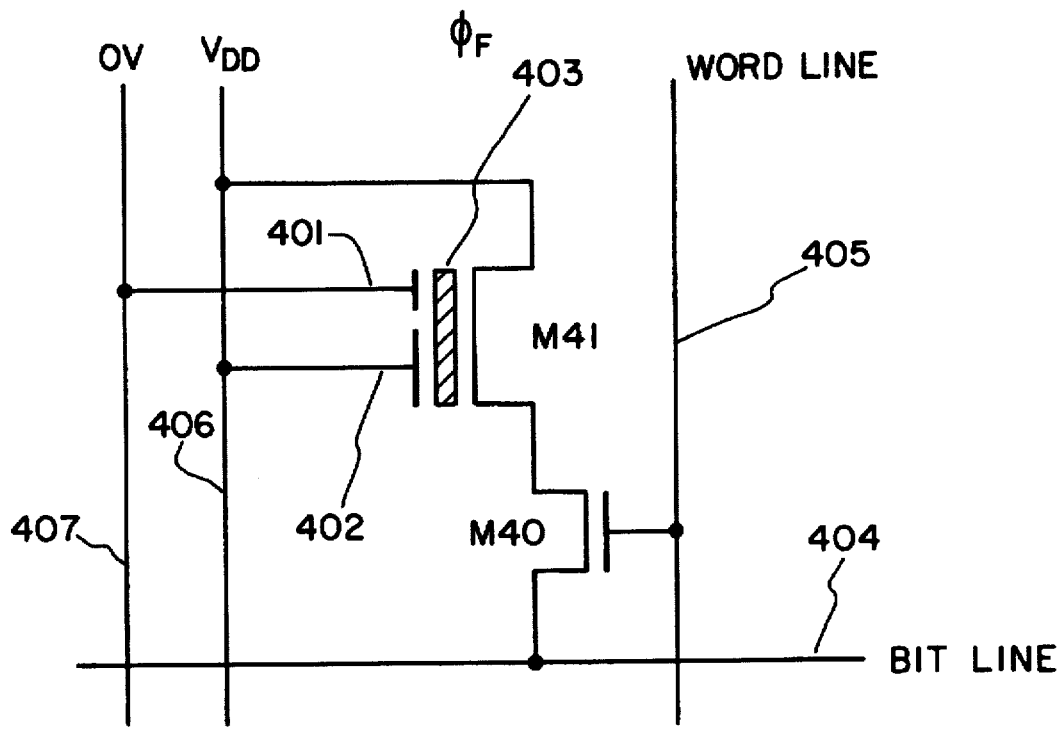
FIG. 4 is a circuit diagram showing the circuit of Embodiment 1, for the case of storing the data value "2".

The single-transistor, 2-bit D/A converter of FIG. 3 can be converted into a memory cell by simply adding a select transistor (M40), as shown in FIG. 4. Table 1 lists the four possible state on the floating gate of the 2-bit digital-to-analog converter of FIG. 3. FIG. 4 depicts a four-valued cell which stores the data value "2". Different values can be programmed into the cell by changing the connections of electrodes 401 and 402 to either $V_{DD}$ or 0 V. This is done by a single masking step in the device fabrication process. In this manner, varying states are obtained on the floating gate (403), as given by Equation (2).

To read data from the cell, the bit line (404) is pre-charge to 0 V, and M40 is turned on by setting the word line (405) high. Therefore, current from the source-follower (M41) raises the bit line voltage. If the threshold voltage of M41 is zero, then the bit line voltage will rise until it equals the floating gate potential $\phi F$.

(Embodiment 2)

Figure 5:
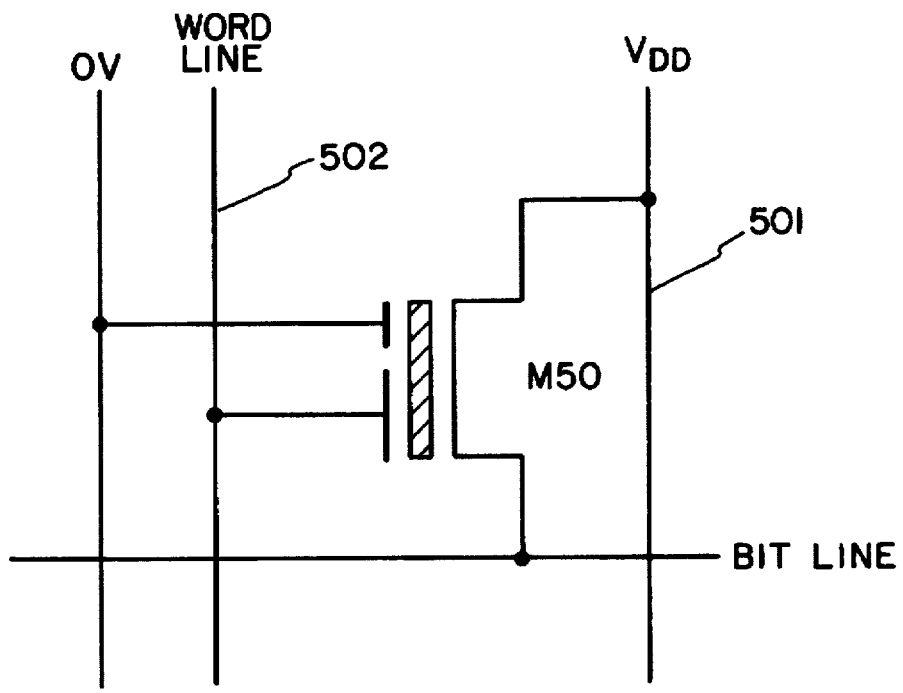
FIG. 5 is a circuit diagram showing the circuit of Embodiment 2, for the case of storing the data value "2".

The cell of Embodiment 1 requires two transistors; however, this cell can be reduced to a single transistor, as depicted in FIG. 5. If the input gates are connected to either the word line (502) or 0 V, then M50 does not turn on unless the word line is high. Therefore, current does not flow from the cell unless the word line is selected, eliminating the need for a separate select transistor.

(Embodiment 3)

Figure 6:
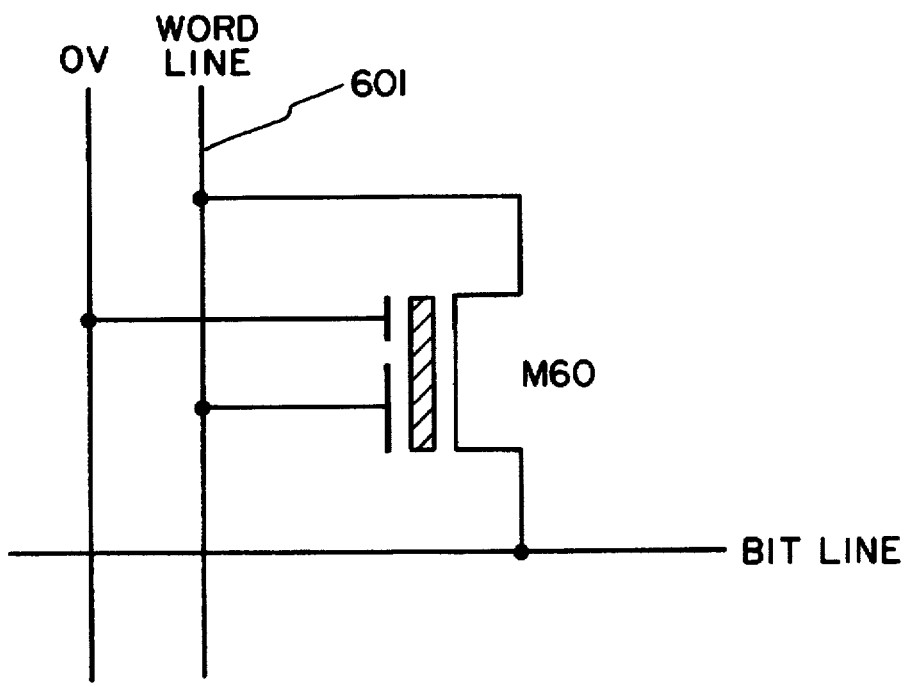
FIG. 6 is a circuit diagram showing the circuit of Embodiment 3, for the case of storing the data value "2".

In Embodiment 2, a separate line (501) must carry the $V_{DD}$ voltage supply to all the cells in the memory array. The circuit shown in FIG. 6 presents an alternative that further decreases the cell area. By connecting the drain electrode (601) of M60 to the word line, the $V_{DD}$ line can be eliminated.

Figure 7:
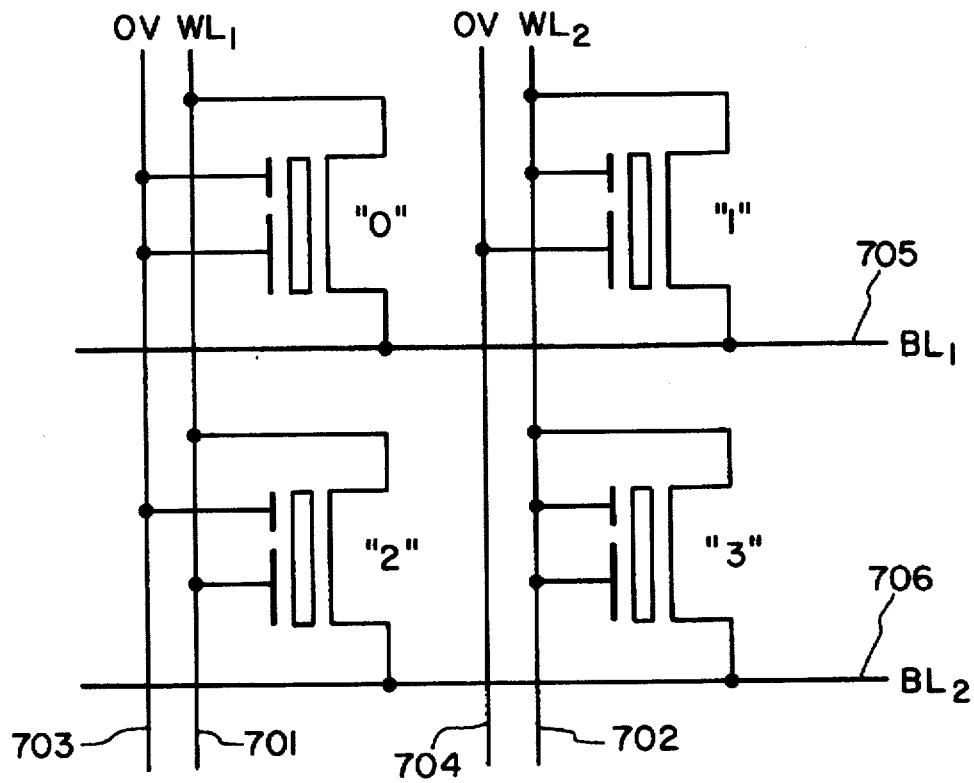
FIG. 7 is a circuit diagram showing a sample array of cells described by Embodiment 3.

FIG. 7 shows an example of an array of four cells. This figure explains how the cells can be arranged in a high density array by sharing common word lines (701 and 702), 0 -V lines (703 and 704), and bit lines (705 and 706).

Figure 8:
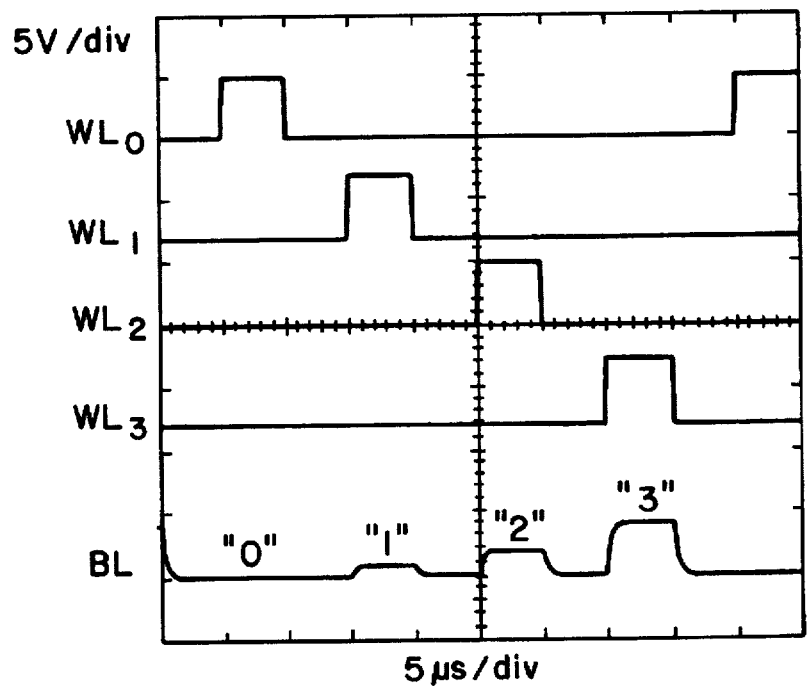
FIG. 8 shows measured operation data of the circuit of Embodiment 3.
Figure 9:
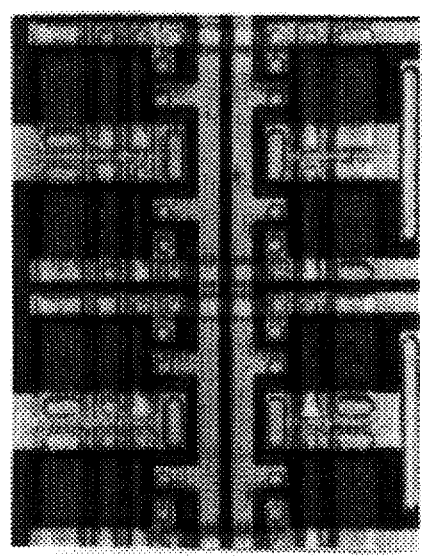
FIG. 9 is a photomicrograph of 4-valued and 8-valued fabricated test cells.

Experimental data for the operation of the circuit in this embodiment is shown in FIG. 8. This data was taken from the fabricated 4-valued test devices shown in FIG. 9. The micrograph in FIG. 9 shows 4-valued and 8-valued cells.

Figure 10A:
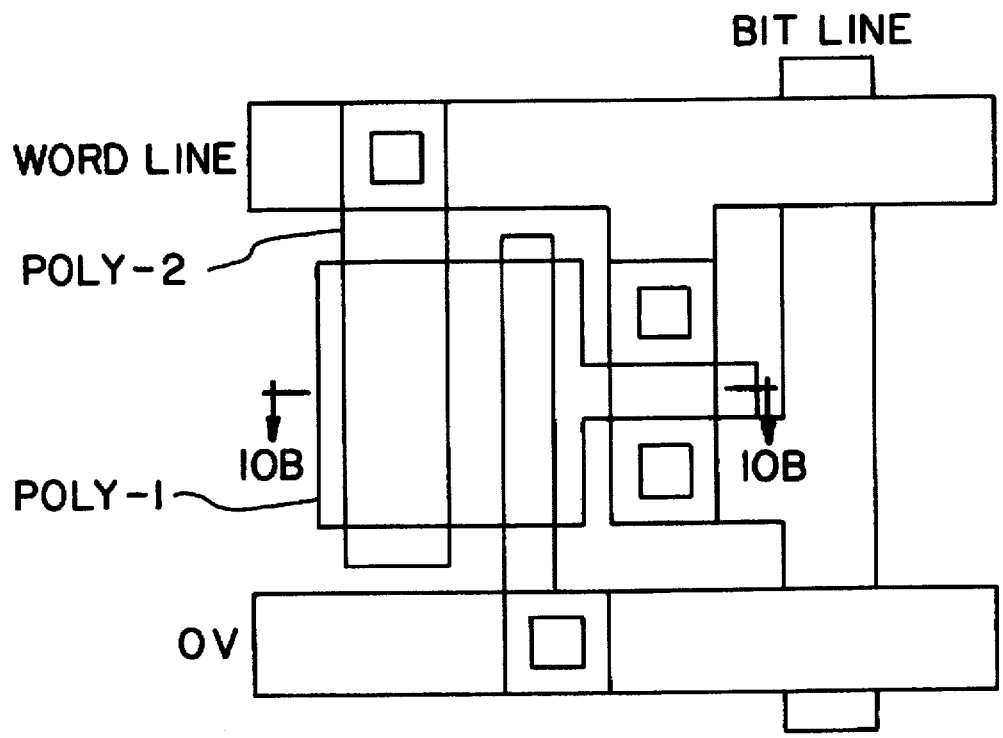
FIG. 10 is a schematic diagram of the top-view and cross-section of the invention.
Figure 10B:
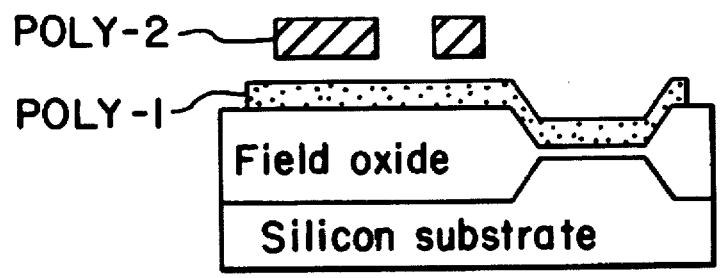

FIG. 10 shows a schematic top-view and cross-section of a four-valued cell. The first polysilicon layer forms the floating gate, and the second polysilicon layer forms the input coupling gates. However, the implementation of this invention is not limited to this particular device structure.

In Embodiments 1, 2, and 3, the bit line is reset to 0 V before each read operation, and an NMOS transistor is used in as a source-follower circuit. Alternatively, the bit line could be pre-charged to $V_{DD}$, and a PMOS source-follower could be used to lower the bit line voltage.

Furthermore, in the above embodiments, leakage currents may flow in unselected cells due to subthreshold currents in the transistor. This happens when $V_T=0$ V and can lead to erroneous data readings. To solve this problem, a positive threshold voltage (for example, $V_T=0.5$ V) could be used instead. In this case, the output voltage will only rise until $\phi F$ −0.5 V. However, it is possible to employ sensing circuitry which detects the reduced voltage level and restores the original data, namely, $\phi F$.

(Embodiment 4)

Figures 11, 13:
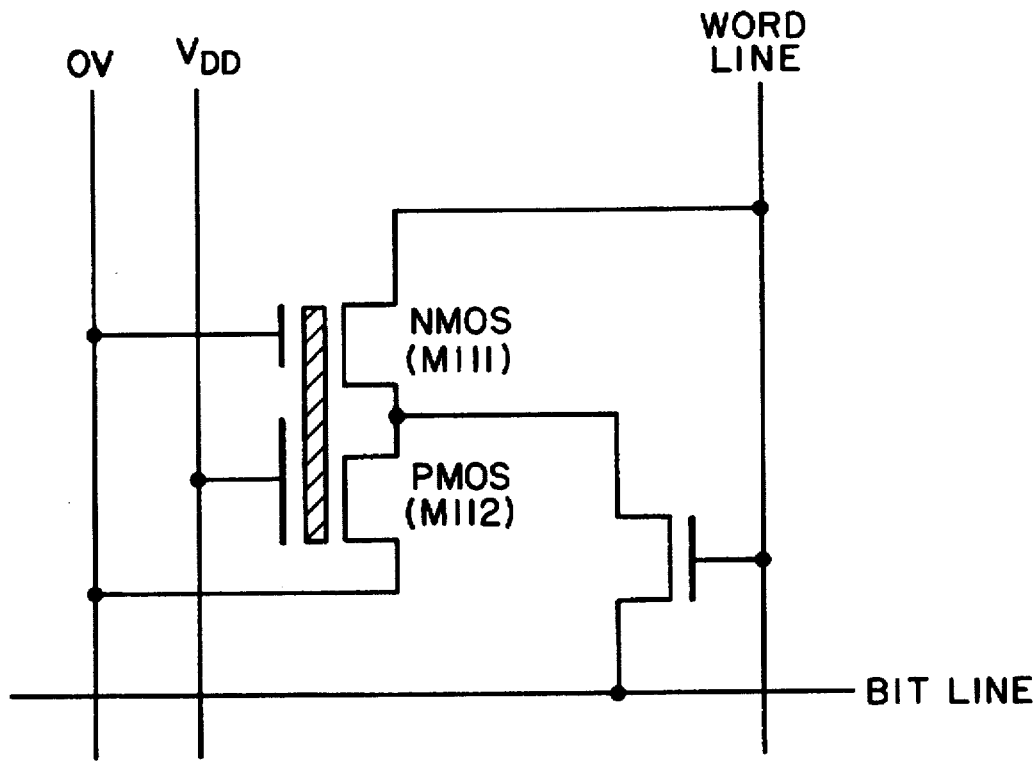
FIG. 11 is a circuit diagram showing the circuit of Embodiment 4, for the case of storing the data value "2".
FIG. 13 shows Table 1 which lists the four possible states on the floating gate of the 2-bit digital to analog converter of FIG. 3.

The NMOS source-follower of Embodiment 1 could be replaced by a CMOS source-follower circuit, consisting of an NMOS (M111) and a PMOS (M112), as depicted in FIG. 11. In this case, the bit line need not be pre-charged since the CMOS source-follower can drive the bit line to both low and high levels, depending on the floating gate potential.

(Embodiment 5)

The number of possible values stored by this cell can be altered by changing the number of binary-weighted input gates. For n binary-weighted input gates, it is possible to store $2^n$ values in the cell. From Equation 2, the floating gate potential in the cell for the case of n binary-weighted input gates is $$\phi_F = \frac{C_1V_1 + C_2V_2 + \ldots + C_nV_n}{C_{total}} = \frac{V_1 + 2V_2 + \ldots + 2^{(n-1)}V_n}{2^0 + 2^1 + \ldots + 2^{(n-1)}} \quad (3)$$

Alternatively, the number of possible values stored by this cell can be altered by using variably-weighted coupling capacitances. In this manner, an infinite number of states can be obtained on the floating gate by using only two input gates and adjusting their coupling ratio. For this case, the floating gate potential is given by $$\phi_F = \frac{C_1V_1 + C_2V_2}{C_1 + C_2} = \frac{V_1 + kV_2}{1 + k}, k = \frac{C_2}{C_1} \quad (4)$$

Since any floating gate potential can be obtained by simply adjusting the ratio k, this cell is capable of storing analog data.

FIG. 12 depicts 8-valued cells implemented by (a) binary-weighted capacitors and (b) variably-weighted capacitors.

Furthermore, in the embodiments above, it is possible that charge will be unintentionally injected onto the floating gate, thus shifting $\phi F$ undesirably. To reset and remove the injected charge and reset the floating gate potential, a switch may be attached to the floating gate. When the cell is in standby mode, the switch can be turned on to reset the floating gate. When the cell is reading out data, the switch must be off.

Furthermore, the embodiments described above can be implemented by using fuses or anti-fuses to program the multivalued data in the cell after the completion of the fabrication process. This can be done instead of mask programming.

INDUSTRIAL APPLICABILITY

By means of the present invention, it is possible to realize the non-volatile storage of multiple-valued or analog data in a read-only memory cell. This cell can be replicated into a matrix of many rows and columns to achieve a high-density memory array.

This invention is especially suitable in systems dealing with multiple-valued or analog information, such as image processors or multiple-valued microprocessors.

What is claimed is:

1. A multi-valued ROM circuit, comprising:

an MOS transistor having a drain electrode, a source electrode and a floating gate electrode, said drain electrode connected to a first signal line which provides a first voltage level, said source electrode connected to a bit line for providing a multi-valued output signal on said bit line, said floating gate electrode capacitively coupled to a plurality of input gates, each said input gate connected to one of a second signal line which carries a second voltage level and a third signal line which is at 0 V to provide a weighted input based on one of said second voltage level and 0 V, said multi-valued output signal assuming a predetermined level in response to a combination of said weighted inputs.

2. The multi-valued ROM circuit according to claim 1, wherein said MOS transistor is an NMOS transistor.

3. The multi-valued ROM circuit according to claim 1, wherein said MOS transistor is a PMOS transistor.

4. A multi-valued ROM circuit, comprising:

an MOS transistor having a source electrode, a drain electrode and a floating gate electrode, said source electrode connected to a bit line for providing a multi-valued output signal on said bit line, said drain electrode connected to a word line which carries a first voltage level, said floating gate electrode capacitively coupled to a plurality of input gate electrodes, each said input gate electrode connected to one of said word line and a zero signal line which is at 0 V to provide a weighted input based on one of said first voltage level and 0 V, said multi-valued output signal assuming a predetermined level in response to a combination of said weighted inputs.

5. The multi-valued ROM circuit according to claim 4, wherein said MOS transistor is an NMOS transistor.

6. The multi-valued ROM circuit according to claim 4, wherein said MOS transistor is a PMOS transistor.

7. A multi-valued ROM circuit, comprising:

a first MOS transistor having a source electrode, a drain electrode and a floating gate electrode, said source electrode connected to a bit line through a second MOS transistor for providing a multi-valued output signal on said bit line, said second MOS transistor having a gate electrode connected to a word line which carries a first voltage level, said drain electrode connected to a second signal line which carries a second voltage level, said floating gate electrode capacitively coupled to a plurality of input gate electrodes, each said input gate electrode connected to one of said second signal line and a third signal line which is at 0 V to provide a weighted input based on one of said second voltage level and 0 V, said multi-valued output signal assuming a predetermined level in response to a combination of said weighted inputs.

8. The multi-valued ROM circuit according to claim 7, wherein said MOS transistor is an NMOS transistor.

9. The multi-valued ROM circuit according to claim 7, wherein said MOS transistor is a PMOS transistor.

* * * * *